(12) United States Patent
Tseng et al.

(10) Patent No.: US 7,508,247 B2
(45) Date of Patent: Mar. 24, 2009

(54) SOURCE DRIVE CIRCUIT

(75) Inventors: Ching-Wu Tseng, Sanchong (TW); Alex Tang, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 11/469,214

(22) Filed: Aug. 31, 2006

(65) Prior Publication Data

US 2007/0075760 A1 Apr. 5, 2007

Related U.S. Application Data

(62) Division of application No. 10/828,117, filed on Apr. 19, 2004, now abandoned.

(30) Foreign Application Priority Data

Mar. 3, 2004 (TW) .............................. 93105479 A

(51) Int. Cl.
*H03L 5/00* (2006.01)
(52) U.S. Cl. .......................... 327/333; 345/98; 345/100

(58) Field of Classification Search ................. 327/333; 345/98, 100
See application file for complete search history.

(56) References Cited

U.S. PATENT DOCUMENTS

| 5,623,222 | A | 4/1997 | Tamagawa | 327/259 |
| 6,351,173 | B1 * | 2/2002 | Ovens et al. | 327/333 |
| 6,445,210 | B2 * | 9/2002 | Nojiri | 326/68 |
| 6,828,825 | B2 * | 12/2004 | Johnson et al. | 326/68 |

* cited by examiner

*Primary Examiner*—Kenneth B. Wells
(74) *Attorney, Agent, or Firm*—J.C. Patents

(57) ABSTRACT

A latchable voltage level shifter is provided. The latchable voltage level shifter comprises: a voltage level shifter receiving an original input signal and generating a high voltage signal according to a timing sequence of a first phase control signal; and a high voltage flip-flop, coupled to the voltage level shifter, receiving the high voltage signal and a second phase control signal, the high voltage flip-flop latching the high voltage signal according to a timing sequence of the second phase control signal and outputting a high voltage output signal. The latchable voltage level shifter can be used in a source drive circuit so as to reduce the layout area and production cost.

19 Claims, 6 Drawing Sheets

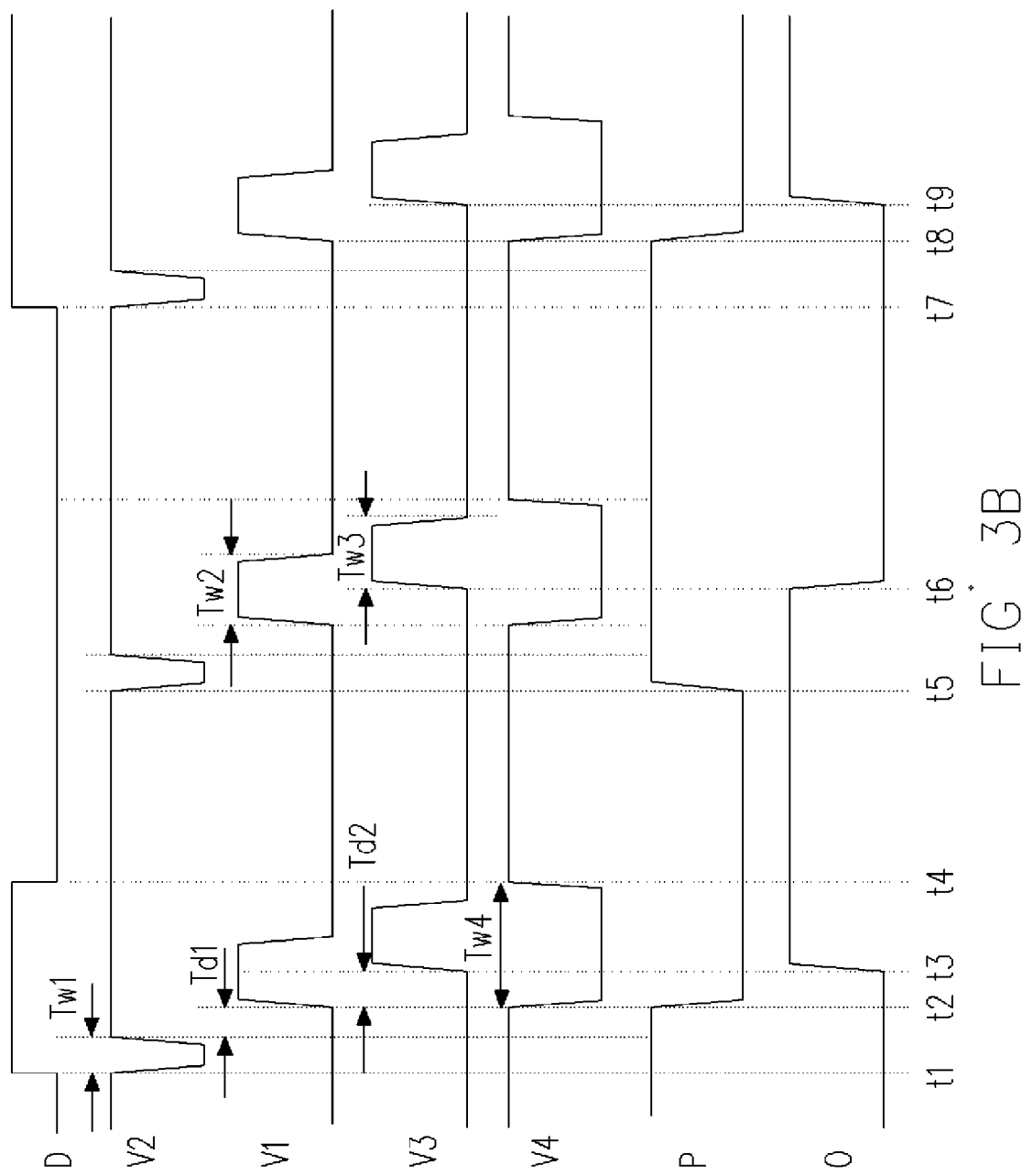

SOURCE DRIVE CIRCUIT

CROSS-REFERENCE TO RELATED APPLICATION

This is a divisional application of patent application Ser. No. 10/828,117, filed on Apr. 19, 2004, now abandoned which claims the priority benefit of Taiwan patent application serial no. 93105479, filed on Mar. 3, 2004 and is now abandoned. The entirety of each of the above-mentioned patent applications is hereby incorporated by reference herein and made a part of this specification.

BACKGROUND OF THE INVENTION

1. Field of the Invention

This invention generally relates to a voltage level shifter, and more particularly to a latchable voltage level shifter with a high voltage flip-flop.

2. Description of Related Art

The electronic circuits usually have to latch the data into the flip-flop according to the predetermined timing sequence and then shift the voltage level of the latched data for subsequent processing. The source drive circuit of the liquid crystal display (LCD) is one example.

FIG. 1 is the block diagram of a traditional LCD source drive circuit. Referring to FIG. 1, the driver circuit is one of the source drive circuits in the LCD. After by the source drive circuit 100 processes the display data DATA, the source drive signal 151 will be obtained. The source drive signal 151 will be sent to one of the source channel of the LCD panel (not shown). The LCD panel receives the source drive signals from each source channel to display the image.

Generally, to correctly latch the display data of the source channels, the line latch 100 will latch the display data DATA according to the first timing sequence DIO to obtain the display data 111. To make sure that the source drive circuit of each source channel can output the source drive signal 151 simultaneously, the prior art uses line latch 120 to latch the display data 111 according to the timing sequence LD to obtain the display data 121; then the voltage level shifter 130 shifts the display data 121 with a lower voltage level of to become the display data 131 with a higher voltage level. The D/A converter 140 converts the digital display data 121 to an analog source drive signal 141. To enhance the driving ability of the source drive signal 141, the operational amplifier 150 amplifies the source drive signal 141 and outputs the source drive signal 151.

However, when designing the traditional voltage level shifter, the designer has to consider the channel length/width ratio of the MOSFET. Because the drafting effect in the semiconductor manufacturing process is almost unavoidable, it becomes difficult to control the channel length/width ratio. In addition, in the traditional design, the designer has to take the line latch and the voltage level shifter into account, which causes that the source drive circuits of the LCD with multi-channels occupy more layout areas and thus increase the power consumption and the production cost.

SUMMARY OF THE INVENTION

The present invention is directed to a latchable voltage level shifter by using a simple circuit structure to integrate the data latch and the voltage level shifter so as to reduce the production cost and the power consumption. The latchable voltage level shifter can use the transistor with any kind of channel length/width ratio and thus will not be affected by the drafting effect.

The present invention is directed to a source drive circuit utilizing the latchable voltage level shifter to drive the display panel. Further, because of the high repetition of the source drive circuits, the present invention can reduce the layout area and integrate the data latch into the voltage level shifter. Hence, it can reduce the production cost and increase the profit.

The present invention is also directed to a high voltage flip-flop applied, for example, in a latchable voltage level shifter.

The latchable voltage level shifter, according to an embodiment of the present invention, comprises: a voltage level shifter and a high voltage flip-flop. The voltage level shifter is adapted for receiving an original input signal and generating a high voltage signal according to a timing sequence of a first phase control signal. The high voltage flip-flop is coupled to the voltage level shifter and is adapted for receiving the high voltage signal and a second phase control signal. The high voltage flip-flop latches the high voltage signal according to a timing sequence of the second phase control signal and outputting a high voltage output signal.

In an embodiment of the present invention, the first phase control signal includes a first clock signal and a second clock signal, and the voltage level shifter includes a low voltage AND gate, an N-type transistor and a P-type transistor. The low voltage AND gate is adapted for receiving the original input signal and the first clock signal and performing an AND operation to output a synchronized low voltage signal. The N-type transistor comprises a gate, a source and a drain. The N-type transistor is coupled to the low voltage AND gate and a voltage shifter output terminal. The gate of the N-type transistor is adapted for receiving the synchronized low voltage signal. The source is coupled to a ground and the drain coupled to the voltage shifter output terminal, wherein the voltage shifter output terminal has a voltage level equal to that of the high voltage output signal. The P-type transistor comprises a gate, a source and a drain is provided. The gate of the P-type transistor is adapted for receiving the second clock signal. The source is coupled to a high voltage level and the drain is coupled to the voltage shifter output terminal. The first clock signal and the second clock signal have a same period.

In an embodiment of the present invention, the second phase control signal includes a third clock signal and a fourth clock signal; and the high voltage flip-flop includes a first switch having a first connecting terminal, a second connecting terminal and a control terminal; a second switch having a first connecting terminal, a second connecting terminal and a control terminal, the control terminal of the second switch is coupled to the fourth clock signal, the first connecting terminal of the second switch is coupled to the second connecting terminal of the first switch; a first high voltage inverter having an input terminal coupled to the second connecting terminal of the first switch and having an output terminal outputting a first output signal; and a second high voltage inverter having an input terminal coupled to the output terminal of the first high voltage inverter and having an output terminal coupled to the second connecting terminal of the second switch and outputting a second output signal, wherein the third clock signal and the fourth clock signal have a same period, and one of the first output signal and the second output signal is the high voltage output signal. The control terminal of the first switch is coupled to the third clock signal, the first connecting terminal of the first switch is coupled to the voltage shifter output terminal. The first switch is adapted for determining a coupling status between the first connecting terminal of the first switch and the second connecting terminal of the first switch according to the third clock signal. The second switch is adapted for determining a coupling status between the first connecting terminal of the second switch and the second connecting terminal of the second switch according to the fourth clock signal.

In an embodiment of the present invention, the latchable voltage level shifter further comprises a capacitor, one terminal of the capacitor coupled to the voltage shifter output terminal, the other terminal of the capacitor coupled to the ground.

According to an embodiment of the present invention, a source drive circuit is provided for driving a display panel. The display panel comprises a line latch, a latchable voltage level shifter, a digital-to-analog converter and amplifier. The line latch is adapted for receiving a display data and a first timing sequence signal and latching the display data according to the first timing sequence signal and outputting an original input signal. The latchable voltage level shifter is coupled to the line latch, and is adapted for receiving the original input signal and a second timing sequence signal and shifting a voltage level of the original input signal according to the second timing sequence signal and outputting a high voltage output signal. The digital-to-analog converter is coupled to the latchable voltage level shifter, and is adapted for receiving the high voltage output signal and converting the high voltage output signal to output a first drive signal corresponding to the high voltage output signal. The amplifier is coupled to the digital-to-analog converter and the display panel, and is adapted for receiving the first drive signal and enhancing a driving ability of the first drive signal to output a second drive signal to drive the display panel.

According to an embodiment of the present invention, a high voltage flip-flop is provided for receiving a high voltage signal, a first clock signal and a second clock signal and latching the high voltage signal according to a timing sequence of the first clock signal and the second clock signal, and outputting a first output signal and a second output signal. The first output signal and the second output signal have an opposite phase. In the present embodiment of the present invention, the high voltage flip-flop comprises a first switch, a second switch, a first high voltage inverter and a second high voltage inverter. The first switch comprises a first connecting terminal, a second connecting terminal, and a control terminal, wherein the control terminal of the first switch is coupled to the first clock signal and the first connecting terminal of the first switch is coupled to the high voltage signal. The first switch is adapted for determining a coupling status between the first connecting terminal of the first switch and the second connecting terminal of the first switch according to the first clock signal. The second switch comprises a first connecting terminal, a second connecting terminal and a control terminal, wherein the control terminal of the second switch is coupled to the second clock signal, the first connecting terminal of the second switch is coupled to the second connecting terminal of the first switch. The second switch is adapted for determining a coupling status between the first connecting terminal of the second switch and the second connecting terminal of the second switch according to the second clock signal. The first high voltage inverter comprises an input terminal coupled to the second connecting terminal of the first switch and an output terminal for outputting a first output signal. The second high voltage inverter comprises an input terminal coupled to the output terminal of the first high voltage inverter and an output terminal coupled to the second connecting terminal of the second switch and outputting a second output signal. The first clock signal and the second clock signal have a same period.

According to an embodiment of the present invention, the data latch is integrated into the voltage level shifter. Therefore, a simpler circuit structure can be used to reduce the production cost and power consumption. The latchable voltage level shifter can fabricated with transistor regardless of channel length/width ratio, and therefore latchable voltage level shifter is unaffected by the drafting effect. According to an embodiment of the present invention, the latchable voltage level shifter can also be applied in a source drive circuit to drive the display panel. Because the number of components of the source drive circuits is reduced, and therefore the layout area can be reduced and the data latch can be integrated into the voltage level shifter. Hence, the production cost can be reduced.

The above is a brief description of some deficiencies in the prior art and advantages of the present invention. Other features, advantages and embodiments of the invention will be apparent to those skilled in the art from the following description, accompanying drawings and appended claims.

BRIEF DESCRIPTION OF THE DRAWINGS

FIG. 3B shows the timing sequence of the signals in FIG. 3A.

DESCRIPTION OF THE EMBODIMENTS

Figure 1:
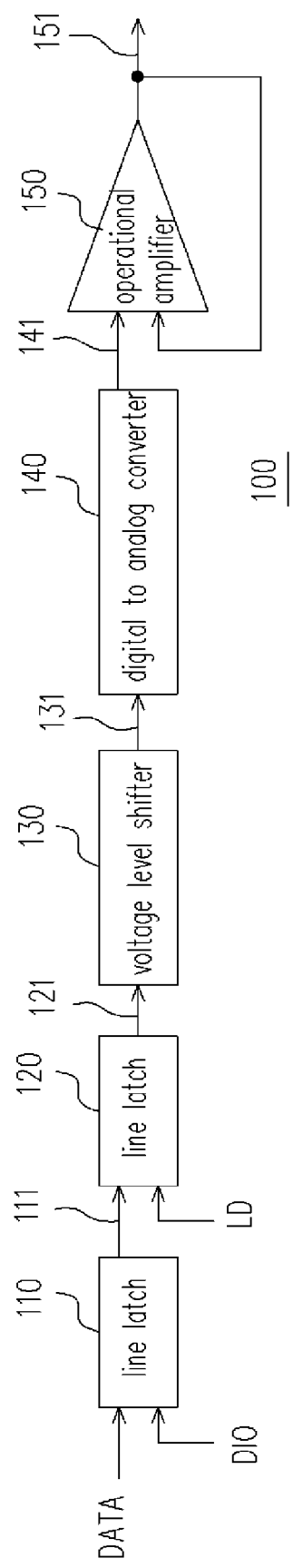
FIG. 1 is the block diagram of a traditional LCD source drive circuit.
Figure 2A:
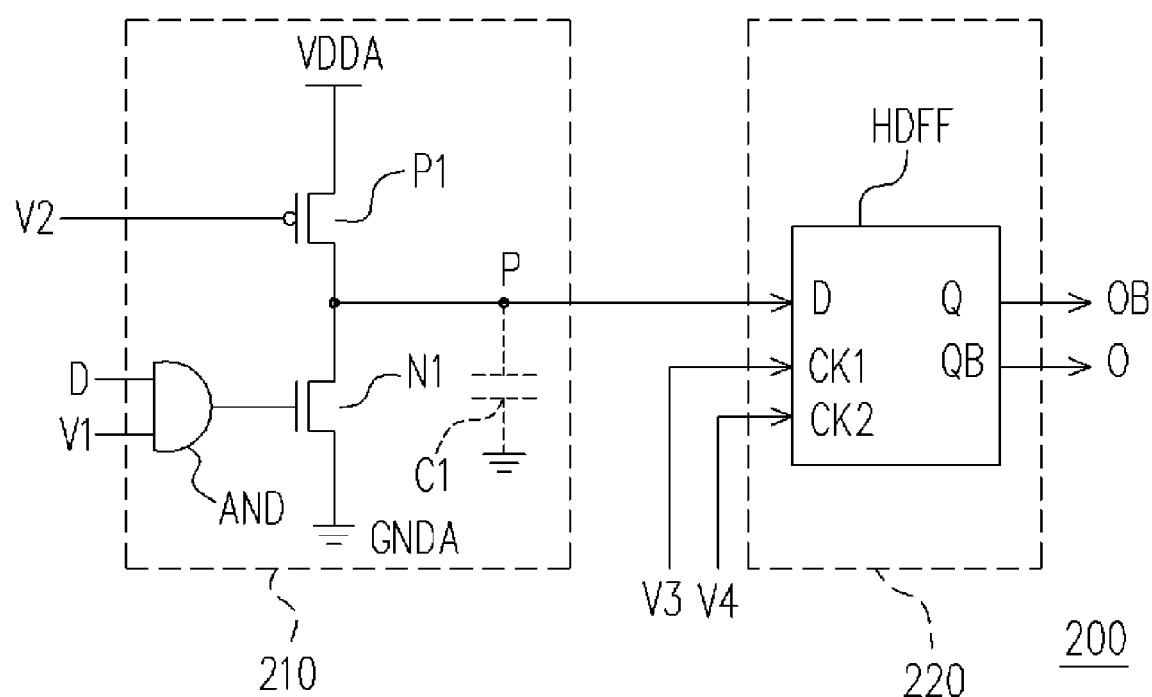
FIG. 2A is the block diagram of a latchable voltage level shifter in accordance with an embodiment of the present invention.
Figure 2B:
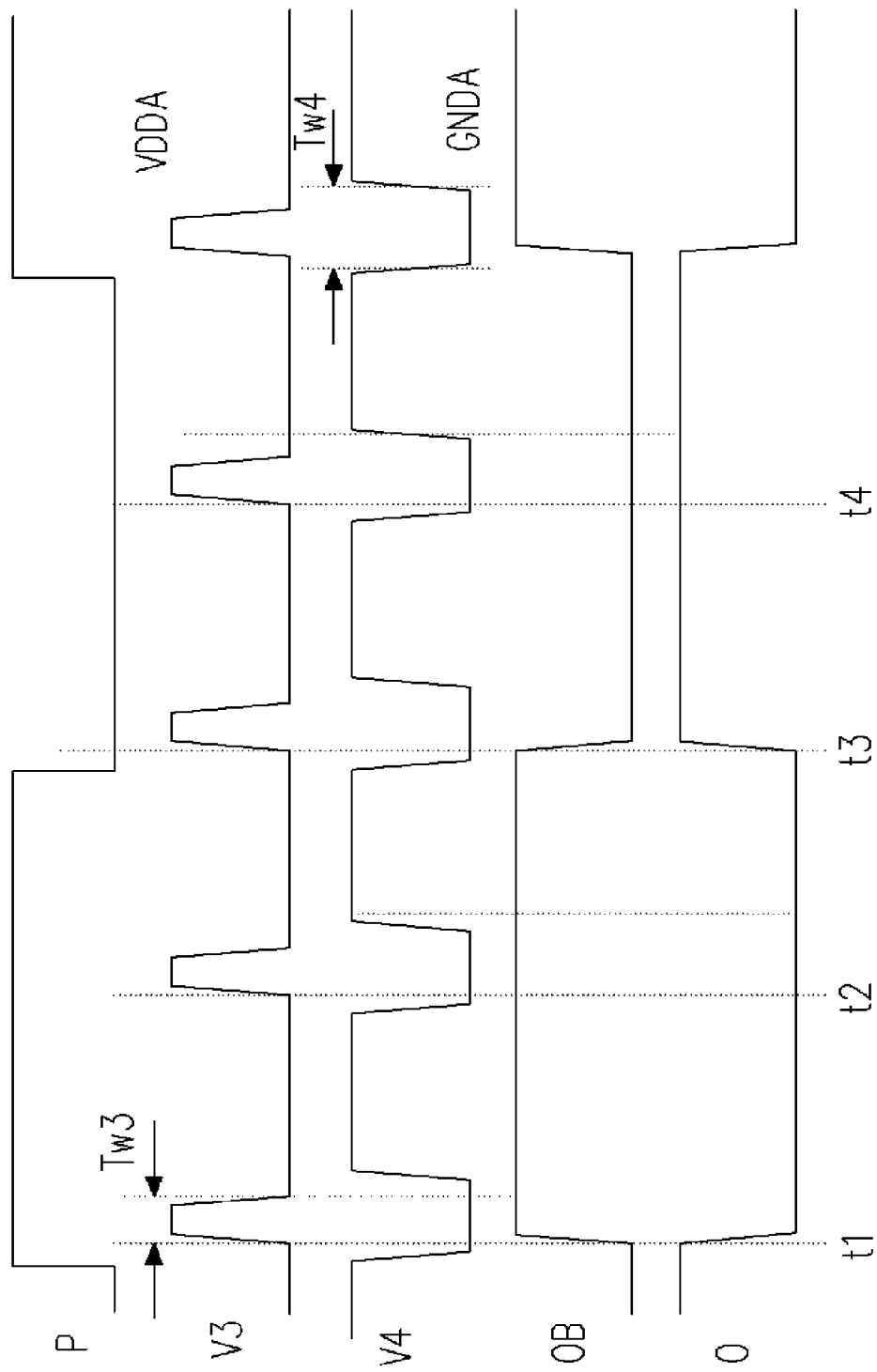
FIG. 2B shows the timing sequence of the signals in FIG. 2A.

When designing the traditional voltage level shifter, the designer has to consider the channel length/width ratio of the MOSFET. Because the drafting effect in the semiconductor manufacturing process is almost unavoidable, it is difficult to control the channel length/width ratio. Hence, the present invention discloses an embodiment of a latchable voltage level shifter (i.e., dynamic voltage level shifter) for resolving/reducing the above problem. FIG. 2A is the block diagram of a latchable voltage level shifter in accordance with an embodiment of the present invention. FIG. 2B shows the timing sequence of the signals in FIG. 2A. Referring to FIGS. 2A and 2B, the latchable voltage level shifter 200, for example, includes a voltage level shifter 210 and a high voltage flip-flop 220. The voltage level shifter 210, in this embodiment, can be constructed by using a traditional voltage level shifter (and thus will not be described here) or by using the voltage level shifter 210 shown in FIG. 2A.

The voltage level shifter 210 includes a low voltage AND gate, an N-type transistor N1 and a P-type transistor P1. The low voltage AND gate receives the original input signal D and the first clock signal V1, and determines whether or not to output the original input signal D to the output terminal according to the timing sequence of the first clock signal V1. The source of the N-type transistor N1 and the source of P-type transistor P1 are coupled to the ground level GNDA and the high voltage level VDDA respectively. The drains of the N-type transistor N1 and the P-type transistor P1 are coupled each other form an inverter structure. The gate of the transistor N1 is coupled to the output terminal of the low voltage AND gate. The gate of the P-type transistor P1 is coupled to the second clock signal V2.

The first clock signal V1 and the second clock signal V2 have the same period. By using the clock signals V1 and V2 to control the transistors N1 and P1, the transistors N1 and P1 will be turned on in different periods. That is, the transistor P1 is turned on first (at the same time the clock signal V1 will turn off the transistor N1) so that the high voltage level VDDA will charge the stray capacitor C1. Then the clock signal V1 controls the gate the transistor N1 to receive the original input signal D (at the same time the transistor P1 is turned off) to obtain the high voltage signal P which has the opposite phase with the original input signal D. The stray capacitor C1 can be implemented by a real capacitor and it would have a better result.

The high voltage signal P is connected to the input terminal of the high voltage flip-flop 220. The high voltage flip-flop 220 can be a traditional high voltage flip-flop HDFF. The high voltage flip-flop HDFF latches input signal according to the third clock signal V3 and the fourth clock signal V4 and then outputs the first output signal O and the second output signal OB. The output signals O and OB have the opposite phases. When the second clock signal input terminal CK2 of the high voltage flip-flop HDFF is coupled to the low voltage level GNDA, it works as a D-type flip-flop. The clock signal V3 is coupled to the first clock signal input terminal CK1 of the high voltage flip-flop HDFF. As shown in FIG. 2B, the voltage level of the high voltage P is at VDDA at time t1; the clock signal V3 changes from low voltage level GNDA to high voltage level VDDA; the high voltage flip-flop HDFF rising edge triggers so that the output signals OB and O change to high voltage level VDDA and to low voltage level GNDA respectively. At time t2, the high voltage flip-flop HDFF rising edge is triggered and the output signals OB and O do not change. At time t3, the voltage level of the high voltage signal P is at GNDA; the high voltage flip-flop HDFF rising edge is triggered so that the output signals OB and O change to a low voltage level GNDA and a high voltage level VDDA respectively. At time t4, the high voltage flip-flop HDFF rising edge is triggered and the output signals O and OB do not change.

Figure 3A:
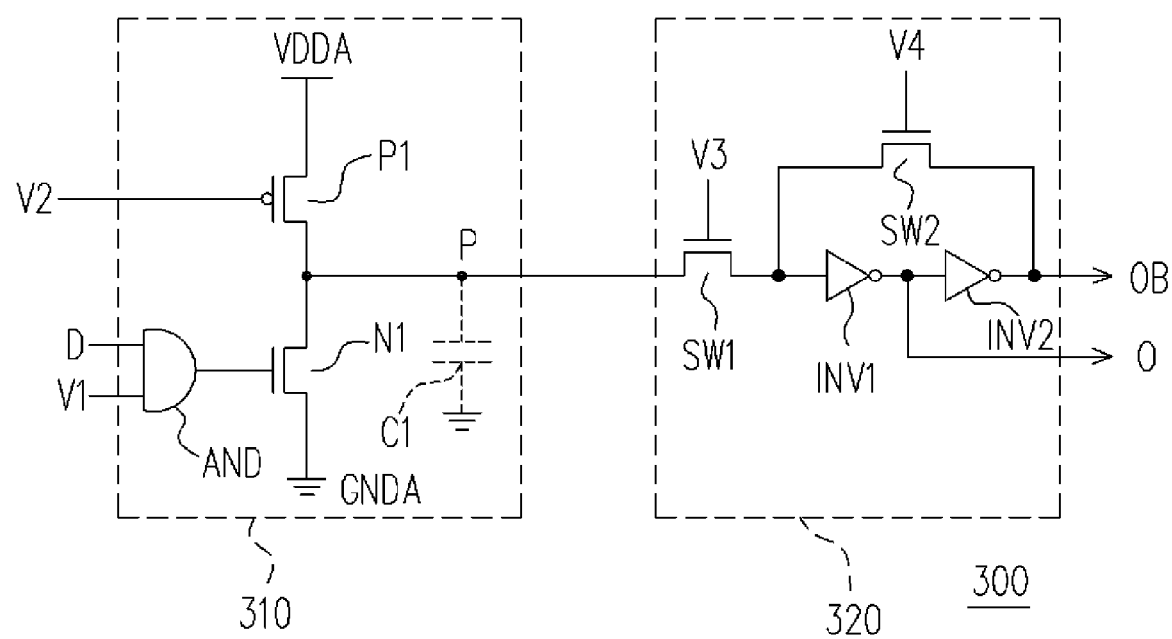
FIG. 3A is the block diagram of a latchable voltage level shifter in accordance with another embodiment of the present invention.

The above high voltage flip-flop 220 can be implemented by other ways as well. Hereinafter, another embodiment will be illustrated to implement the high voltage flip-flop. FIG. 3A is the block diagram of a latchable voltage level shifter in accordance with another embodiment of the present invention. FIG. 3B shows the timing sequence of the signals in FIG. 3A. Referring to FIGS. 3A and 3B, the latchable voltage level shifter 300 for example includes a voltage level shifter 310 and a high voltage flip-flop 320. The voltage level shifter 310 in this embodiment is the same as that in the above embodiment and thus will not be described herein.

The high voltage flip-flop 320 in this embodiment includes a first switch SW1, a second switch SW2, a first high voltage inverter INV2 and a second high voltage inverter INV2. The first switch SW1 and the second switch SW2 depend on the third clock signal V3 and the fourth clock signal V4 to determine their connection status respectively. In this embodiment, two N-type transistors can provide the functions of the first switch SW1 and the second switch SW2.

The timing sequence for the latchable voltage level shifter 300 is shown in FIG. 3B. The original input signal D at time t1 changes to high level; the second clock signal V2 in a form of periodic signal inputs a negative pulse with a width of Tw1; the voltage level of the high voltage signal P becomes at the high voltage level VDDA at the time because the transistor P1 is on. At time t2, the first clock signal V1 inputs a positive pulse with a width of Tw2; the voltage level of the clock signal V4 changes to the low voltage level GNDA at the time of turning off the second switch SW2; the transistor N1 will be turned on because of the original input signal D; hence the voltage level of the high voltage signal P changes to the low voltage level GNDA. At time t3, the third clock signal V3 inputs a positive pulse with a width of Tw3; the transistor N1 and the first switch SW1 are maintained on; hence the high voltage signal P passes through the first high voltage inverter INV1 to obtain a high voltage output signal O (the voltage level changes to the high voltage level VDDA.) At time t4, the switch SW1 is turned off; although the original input signal D changes to a low level, it will not affect the high voltage output signal O. At the time the clock signal V4 changes to the high voltage level VDDA, it turns the switch SW2 on; the high voltage output signal OB makes the flip-flop latch the data.

Likewise, at time t5, the second clock signal V2 in a form of periodic signal inputs a negative pulse; the voltage level of the high voltage signal P changes to the high voltage level VDDA at the time because the transistor P1 is on. At time t6, the clock signal V3 inputs a positive pulse; at this time the transistor N1 and the switch SW1 are maintained on; hence the high voltage signal P passes through the first high voltage inverter INV1 to obtain a high voltage output signal O (the voltage level changes to the low voltage level GNDA.) At time t7, the original input signal D is rendered high; the second clock signal V2 in a form of periodic signal inputs a negative pulse; the voltage level of the high voltage signal P changes to the high voltage level VDDA at this time because the transistor P1 is on. At time t8, the first clock signal V1 inputs a positive pulse; the transistor N1 is turned on because of the original input signal D; hence the voltage level of the high voltage signal P changes to the low voltage level GNDA. At time t9, the clock signal V3 inputs a positive pulse; at this time the transistor N1 and the switch SW1 are maintained on; hence the high voltage signal P passes through the first high voltage inverter INV1 to obtain a high voltage output signal O (the voltage level becomes at the high voltage level VDDA.) In this embodiment, the clock signals V1, V2, V3, and V4 are synchronized periodical signals.

In addition, when designing the traditional source drive circuit of the display panel, the designer has to consider the channel length/width ratio of the MOSFET, which causes the voltage level shifters of the source drive circuits occupy a considerably large area. To resolve this problem, the present invention further discloses another embodiment by taking the LCD panel as an example. By utilizing the latchable voltage level shifter in the source drive circuit of the LCD panel, the present invention can reduce the layout area and the production cost.

Figure 4:
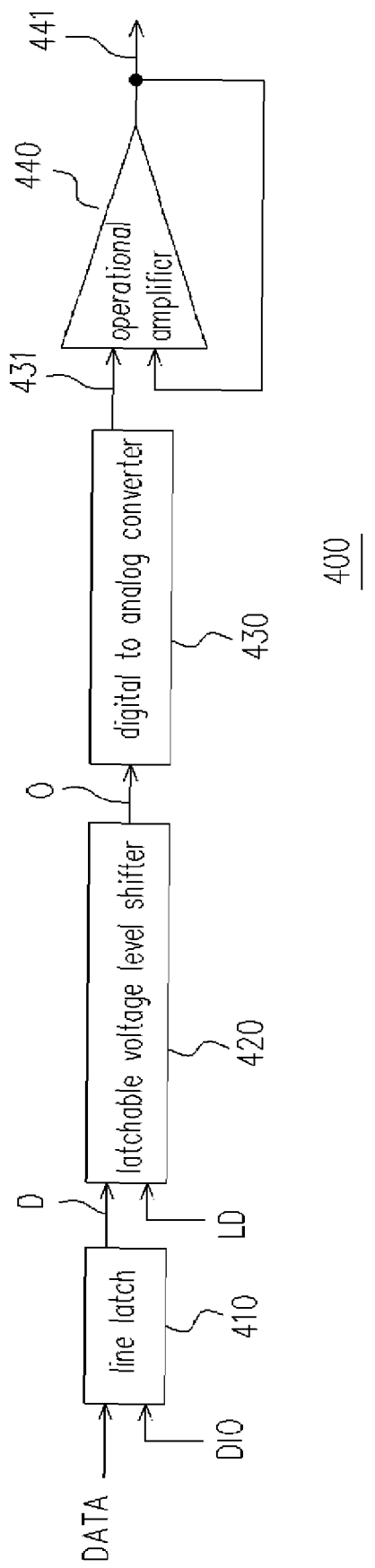
FIG. 4 is the block diagram of a LCD source drive circuit in accordance with an embodiment of the present invention.

FIG. 4 is the block diagram of a LCD source drive circuit in accordance with an embodiment of the present invention. Referring to FIG. 4, the source drive circuit 400 in FIG. 4 is one of the source drive circuits in the LCD. After the source drive circuit 400 processes the display data DATA, the source drive signal 441 is obtained. The source drive signal 441 is sent to one of the source channel of the LCD panel (not shown). The LCD panel receives the source drive signals from each source channel to display the image.

To correctly latch the display data of the source channels, the line latch 400 latches the display data DATA according to the first timing sequence DIO to obtain the original input signal D. To make sure that the source drive circuit of each source channel can output the source drive signal 441 simultaneously, it can use the latchable voltage level shifter 420 to latch the original input signal D according to the timing sequence LD and to shift the voltage level of the original input signal D to obtain a high voltage signal O. The D/A converter 430 converts the digital high voltage signal O to an analog source drive signal 431. To enhance the driving ability of the source drive signal 431, the operational amplifier 440 amplifies the source drive signal 431 and outputs the source drive signal 441.

In this embodiment, the latchable voltage level shifter 420 can be implemented by using the latchable voltage level shifter 200 (in FIG. 2A) or the latchable voltage level shifter 300 (in FIG. 3A), and thus a detailed description thereof will not be repeated again. The second timing sequence LD includes the clock signals V1, V2, V3, and V4.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A source drive circuit for driving a display panel, comprising:
   a line latch, for receiving a display data input signal and a first timing sequence signal, said line latch latching said display data input signal according to said first timing sequence signal and outputting an original input signal;
   a latchable voltage level shifter, coupled to said line latch, for receiving said original input signal and a second timing sequence signal including a first phase control signal and a second phase control signal, said first phase control signal includes a first clock signal and a second clock signal, said latchable voltage level shifter including a voltage level shifter for receiving said original input signal and generating a high voltage signal according to a timing sequence of said first phase control signal and a high voltage flip-flop coupled to said voltage level shifter for receiving said high voltage signal and said second phase control signal, latching said high voltage signal according to a timing sequence of said second phase control signal and outputting said high voltage signal;
   a digital-to-analog converter, coupled to said latchable voltage level shifter, for receiving said high voltage signal and converting said high voltage signal to output a first drive signal corresponding to said high voltage signal; and
   an amplifier, coupled to said digital-to-analog converter and said display panel, for receiving said first drive signal and enhancing a driving ability of said first drive signal to output a second drive signal to drive said display panel.

2. The source drive circuit of claim 1, wherein said voltage level shifter includes
   a low voltage AND gate, for receiving said original input signal and said first clock signal and performing an AND operation to output a synchronized low voltage signal;
   an N-type transistor, coupled to said low voltage AND gate and a voltage shifter output terminal, said N-type transistor having a gate for receiving said synchronized low voltage signal, a source coupled to a ground, a drain coupled to said voltage shifter output terminal, said voltage shifter output terminal having a voltage level equal to that of said high voltage signal; and
   a P-type transistor having a gate receiving said second clock signal, a source coupled to a high voltage level and a drain coupled to said voltage shifter output terminal;
   wherein, said first clock signal and said second clock signal have the same period.

3. The source drive circuit of claim 1, wherein said second phase control signal includes a third clock signal and a fourth clock signal, and said high voltage flip-flop includes:
   a first switch having a first connecting terminal, a second connecting terminal, and a control terminal, said control terminal of said first switch being coupled to said third clock signal, said first connecting terminal of said first switch being coupled to said voltage shifter output terminal, said first switch determining a coupling status between said first connecting terminal of said first switch and said second connecting terminal of said first switch according to said third clock signal;
   a second switch having a first connecting terminal, a second connecting terminal, and a control terminal, said control terminal of said second switch being coupled to said fourth clock signal, said first connecting terminal of said second switch being coupled to said second connecting terminal of the first switch, said second switch determining a coupling status between said first connecting terminal of said second switch and said second connecting terminal of said second switch according to said fourth clock signal;
   a first high voltage inverter having an input terminal coupled to said second connecting terminal of said first switch and having an output terminal outputting a first output signal; and
   a second high voltage inverter having an input terminal coupled to said output terminal of said first high voltage inverter and having an output terminal coupled to said second connecting terminal of said second switch and outputting a second output signal;
   wherein said third clock signal and said fourth clock signal have the same period, and one of said first output signal and said second output signal is said high voltage output signal.

4. The source drive circuit of claim 3, wherein said first switch is an N-type transistor.

5. The source drive circuit of claim 3, wherein said second switch is an N-type transistor.

6. The source drive circuit of claim 1, further comprising a capacitors one terminal of said capacitor being coupled to said voltage shifter output terminal, the other terminal of said capacitor being coupled to ground.

7. The source drive circuit of claim 1, wherein said first phase control signal and said second phase control signal have the same period.

8. The source drive circuit of claim 1, wherein said display panel is a liquid crystal display panel.

9. A source drive circuit, comprising:
   a line latch, for receiving a display data input signal and a timing sequence signal, said line latch latching said display data input signal according to said timing sequence signal and outputting an original input signal;
   a latchable voltage level shifter, comprising
      a voltage level shifter, for receiving said original input signal and generating a high output voltage signal from the original input signal according to a timing sequence of a first phase control signal, wherein said first phase control signal includes a first clock signal and a second clock signal; and a high voltage flip-flop, coupled to said voltage level shifter, for receiving said high voltage output signal and a second phase control signal, said high voltage flip-flop latching said high voltage output signal according to a timing sequence of said second phase control signal and outputting said high voltage output signal; and a converter, coupled to said latchable voltage level shifter, for receiving said high voltage output signal and converting said high voltage output signal to output a first drive signal corresponding to said high voltage output signal for driving the display panel.

10. The source drive circuit of claim 9, further comprising an amplifier, coupled to said digital-to-analog converter and said display panel, for receiving said first drive signal and enhancing a driving ability of said first drive signal to output a second drive signal to drive said display panel.

11. The source drive circuit of claim 9, wherein said voltage level shifter includes a low voltage logic gate, for receiving said original input signal and said first clock signal and performing an logic operation to output a synchronized low voltage signal;

an N-type transistor, coupled to said low voltage logic gate and a voltage shifter output terminal, said N-type transistor having a gate for receiving said synchronized low voltage signal, a source coupled to a ground, a drain coupled to said voltage shifter output terminal, said voltage shifter output terminal having a voltage level equal to that of said high voltage output signal; and a P-type transistor having a gate receiving said second clock signal, a source coupled to a high voltage level and a drain coupled to said voltage shifter output terminal;

wherein said first signal and said second clock signal have the same period.

12. The source drive circuit of claim 9, wherein said second phase control signal includes a third clock signal and a fourth clock signal, and said high voltage flip-flop includes:

a first switch having a first connecting terminal, a second connecting terminal, and a control terminal, said control terminal of said first switch being coupled to said third clock signal, said first connecting terminal of said first switch being coupled to said voltage shifter output terminal, said first switch determining a coupling status between said first connecting terminal of said first switch and said second connecting terminal of said first switch according to said third clock signal;

a second switch having a first connecting terminal, a second connecting terminal, and a control terminal, said control terminal of said second switch being coupled to said fourth clock signal, said first connecting terminal of said second switch being coupled to said second connecting terminal of the first switch, said second switch determining a coupling status between said first connecting terminal of said second switch and said second connecting terminal of said second switch according to said fourth clock signal;

a first high voltage inverter having an input terminal coupled to said second connecting terminal of said first switch and having an output terminal outputting a first output signal; and a second high voltage inverter having an input terminal coupled to said output terminal of said first high voltage inverter and having an output terminal coupled to said second connecting terminal of said second switch and outputting a second output signal;

wherein said third clock signal and said fourth clock signal have the same period, and one of said first output signal and said second output signal is said high voltage output signal.

13. The source drive circuit of claim 12, wherein said first switch is an N-type transistor.

14. The source drive circuit of claim 12, wherein said second switch is an N-type transistor.

15. The source drive circuit of claim 9, further comprising a capacitor, one terminal of said capacitor being coupled to said voltage shifter output terminal, the other terminal of said capacitor being coupled to ground.

16. The source drive circuit of claim 9, wherein said first phase control signal and said second phase control signal have the same period.

17. The source drive circuit of claim 9, wherein said source drive circuit is used to drive a display panel.

18. The source drive circuit of claim 9, wherein said display panel is a liquid crystal display panel.

19. A source drive circuit for driving a display panel, comprising:

a line latch, for receiving a display data input signal and a first timing sequence signal, said line latch latching said display data input signal according to said first timing sequence signal and outputting an original input signal;

a latchable voltage level shifter, coupled to said line latch, for receiving said original input signal and a second timing sequence signal including a first phase control signal and a second phase control signal, said first phase control signal includes a first clock signal and a second clock signal, and, said latchable voltage level shifter including a voltage level shifter for receiving said original input signal and generating a high voltage signal according to a timing sequence of said first phase control signal and a high voltage flip-flop coupled to said voltage level shifter for receiving said high voltage signal and said second phase control signal, latching said high voltage signal according to a timing sequence of said second phase control signal and outputting said high voltage output signal, wherein said original input signal is a single end input signal for said voltage level shifter;

a digital-to-analog converter, coupled to said latchable voltage level shifter, for receiving said high voltage output signal and converting said high voltage output signal to output a first drive signal corresponding to said high voltage output signal; and an amplifier, coupled to said digital-to-analog converter and said display panel, for receiving said first drive signal and enhancing a driving ability of said first drive signal to output a second drive signal to drive said display panel.

* * * * *